United States Patent
Lee et al.

(10) Patent No.: US 11,527,673 B2
(45) Date of Patent: Dec. 13, 2022

(54) METHOD OF TEXTURING SEMICONDUCTOR SUBSTRATE, SEMICONDUCTOR SUBSTRATE MANUFACTURED USING THE METHOD, AND SOLAR CELL INCLUDING THE SEMICONDUCTOR SUBSTRATE

(71) Applicant: KOREA INSTITUTE OF SCIENCE AND TECHNOLOGY, Seoul (KR)

(72) Inventors: Doh Kwon Lee, Seoul (KR); In Ho Kim, Seoul (KR); Won Mok Kim, Seoul (KR); Jong Keuk Park, Seoul (KR); Taek Sung Lee, Seoul (KR); Doo Seok Jeong, Seoul (KR); Hyeon Seung Lee, Seoul (KR); Jeung Hyun Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 866 days.

(21) Appl. No.: 16/333,252

(22) PCT Filed: Nov. 1, 2017

(86) PCT No.: PCT/KR2017/012212
§ 371 (c)(1),
(2) Date: Mar. 14, 2019

(87) PCT Pub. No.: WO2019/054555
PCT Pub. Date: Mar. 21, 2019

(65) Prior Publication Data
US 2020/0343404 A1 Oct. 29, 2020

(30) Foreign Application Priority Data
Sep. 14, 2017 (KR) .......... 10-2017-0117578

(51) Int. Cl.
*B82Y 40/00* (2011.01)
*H01L 31/18* (2006.01)
(Continued)

(52) U.S. Cl.
CPC ...... *H01L 31/1892* (2013.01); *B81C 1/00539* (2013.01); *H01L 31/02366* (2013.01);
(Continued)

(58) Field of Classification Search
CPC .......... H01L 31/1892; H01L 31/02366; H01L 31/0547; H01L 21/0274; H01L 21/31116;
(Continued)

(56) References Cited

U.S. PATENT DOCUMENTS 9,956,743 B2 * 5/2018 Jin ......................... B05D 5/08
2009/0236317 A1 9/2009 Yost et al.
(Continued)

FOREIGN PATENT DOCUMENTS

JP 2017-504179 A * 2/2017 ....... H01L 31/02363
KR 10-0180621 B1 4/1999
(Continued)

OTHER PUBLICATIONS

Anastassios Mavrokefalos et al., "Efficient Light Trapping in Inverted Nanopyramid Thin Crystalline Silicon Membranes for Solar Cell Applications", Nano Letters, 2012, pp. 2792-2796, vol. 12.

*Primary Examiner* — Lan Vinh
(74) *Attorney, Agent, or Firm* — Rabin & Berdo, P.C.

(57) ABSTRACT

An embodiment includes a method of texturing a semiconductor substrate, a semiconductor substrate manufactured using the method, and a solar cell including the semiconductor substrate, the method including: forming metal nanoparticles on a semiconductor substrate, primarily etching the semiconductor substrate, removing the metal nanopar-
(Continued)

ticles, and secondarily etching the primarily etched semiconductor substrate to form nanostructures.

10 Claims, 20 Drawing Sheets

(51) Int. Cl.
    *H01L 31/054*     (2014.01)
    *B81C 1/00*     (2006.01)
    *H01L 31/0236*     (2006.01)

(52) U.S. Cl.
    CPC .. *H01L 31/0547* (2014.12); *B81C 2201/0133* (2013.01); *B82Y 40/00* (2013.01)

(58) Field of Classification Search
    CPC ......... H01L 31/02363; H01L 21/02601; B81C 1/00539; B81C 2201/0133; B82Y 40/00
    USPC ....... 216/13, 79, 95, 100; 438/745, 754, 756
    See application file for complete search history.

(56) References Cited

U.S. PATENT DOCUMENTS

| | | | |
|---|---|---|---|
| 2013/0298977 A1* | 11/2013 | Chen | B82Y 30/00 |
| | | | 257/618 |
| 2014/0106491 A1 | 4/2014 | Park et al. | |
| 2016/0226010 A1* | 8/2016 | Weitekamp | H01L 51/0068 |
| 2016/0336411 A1* | 11/2016 | Åberg | H01L 21/02214 |

FOREIGN PATENT DOCUMENTS

| | | |
|---|---|---|
| KR | 10-2010-0032663 A | 3/2010 |
| KR | 10-2012-0010152 A | 2/2012 |
| KR | 10-2013-0020458 A | 2/2013 |
| KR | 10-1372413 B1 | 3/2014 |
| KR | 10-2016-0146126 A | 12/2016 |
| KR | 10-2017-0024450 A | 3/2017 |

* cited by examiner

1201

1202

METHOD OF TEXTURING SEMICONDUCTOR SUBSTRATE, SEMICONDUCTOR SUBSTRATE MANUFACTURED USING THE METHOD, AND SOLAR CELL INCLUDING THE SEMICONDUCTOR SUBSTRATE

TECHNICAL FIELD

The present invention relates to a technique of texturing a semiconductor substrate, and more particularly, to a method of texturing a semiconductor substrate to improve light collection efficiency and reduce material loss, a semiconductor substrate manufactured using the method, and a solar cell including the semiconductor substrate.

BACKGROUND ART

A solar cell, which is a device configured to convert light energy into electric energy, has attracted considerable attention as a future environmentally friendly energy source. The solar cell generates electricity by using properties of semiconductors. Specifically, the solar cell has a PN junction structure in which a positive (P)-type semiconductor is bonded to a negative (N)-type semiconductor. When solar light is incident on the solar cell, holes and electrons are generated in the semiconductors. In this case, due to an electric field generated at the PN junction, the holes are moved toward the P-type semiconductor while the electrons are moved toward the N-type semiconductor such that electric potential is caused.

Generally, power generation performance of a solar cell is measured on the basis of photoelectric conversion efficiency at which light energy is converted into electric energy. However, part of solar light incident on the solar cell is reflected by various interlayer boundaries and doesn't contribute toward power generation of the solar cell but degrades reflection efficiency of the solar cell. Accordingly, a reflectance of solar light should be reduced to improve efficiency of the solar cell.

To this end, a texturing process is widely being used to manufacture solar cells. The texturing process is a process of roughening surfaces of semiconductor substrates or various layers included in the solar cells. The texturing process refers to a process of forming concave-convex patterns or pyramid-type patterns on the surfaces of the semiconductor substrates or the various layers. For example, when a pyramid-type pattern is formed on the surface of the semiconductor substrate, after light first reaches and is incident on a wall of an inclined pyramid, part of the light may be absorbed by the wall of the inclined pyramid while another part of the light may be reflected and returned to its source. In this case, by allowing the returning light to keep being incident on walls of other neighboring pyramids, light absorptance is increased. Accordingly, when the texturing process is performed on a solar cell, an effect of reducing surface reflection of the solar cell, an effect of improving carrier collection, and a light confinement effect due to internal reflection of the solar cell may be obtained.

For example, Patent Document 1 (Korean Patent Publication No. 0180621), which proposes a conventional texturing method, discloses a method of disclosing a method of texturing a silicon substrate by using a texture etching solution including a mixture of about 0.5% to 5.0% by volume of potassium hydroxide solution, about 3.0% to about 20.0% by volume of isopropyl alcohol, and about 75.0% to about 96.5% by volume of deionized water. According to the method, a fine pyramid structure is formed on a surface of a silicon wafer. The textured silicon surface may increase internal reflection efficiency and increase efficiency of a solar cell.

However, since sizes of pyramid structures formed using the above-described method are in the range of several microns to several tens of microns, a wafer loss of several tens of microns in thickness occurs during an etching process. In addition, there is a limit in the application of the above-described method to an ultrathin wafer solar cell having a thickness of about 50 microns or less, which is advantageous for cost reduction.

To solve this problem, research is being conducted on a method of texturing a surface of a silicon wafer at a nano- or sub-micron micron size by using nano-lithography. Examples of a nano-lithography process include a nano-imprint process (refer to Patent Document), a laser interference lithography process (refer to Non-patent Document 1), and a photolithography process (refer to Patent Document 3) using extreme ultraviolet (EUV). However, there is a problem in that most of the processes incur high process costs.

Meanwhile, Patent Document 4 (US 2009/0236317 A1), which proposes another conventional method of texturing a surface of a silicon wafer at a nano- or sub-micron size, describes a method of synthesizing a metal into nano-sized particles by using a vacuum evaporation method, and performing a nano-patterning process by using a metal catalyst etching method. Although the method includes a relatively low-cost process in comparison to the above-described nano-lithography processes, the method is problematic in that expensive noble metals such as gold (Au) and silver (Ag) are used and metal etching results are sensitive to an etching solution environment to preclude a large-area process.

PRIOR-ART DOCUMENTS

Patent Documents (Patent Document 1) KR0180621 B
(Patent Document 2) KR1020120010152 A
(Patent Document 3) KR1020130020458 A
(Patent Document 4) US20090236317 A1

Non-Patent Document (Non-patent Document 1) Nano Lett. 2012, 12, 2792-2796

DISCLOSURE

Technical Problem

The present invention is directed to providing a method of texturing a surface of a semiconductor substrate to have nanostructures.

The present invention is also directed to providing a method of texturing a semiconductor substrate which incurs low process costs and is applicable to a full-wafer-scale large-area process.

The present invention is also directed to providing a semiconductor substrate which reduces reflectance of incident light to exhibit high light absorptance and may be applied to an ultrathin solar cell.

Furthermore, the present invention is directed to providing a solar cell including the semiconductor substrate.

Aspects of the present invention are not limited by the above description, and other unmentioned aspects should be clearly understood by one of ordinary skill in the art from exemplary embodiments described herein.

Technical Solution

According to an aspect of the present invention, there is provided a method of texturing a semiconductor substrate, the method including forming metal nanoparticles on a semiconductor substrate, primarily etching the semiconductor substrate, removing the metal nanoparticles, and secondarily etching the primarily etched semiconductor substrate to form nanostructures.

In an exemplary embodiment of the present invention, before forming the metal nanoparticles, the method may further include depositing a dielectric thin film on the semiconductor substrate, wherein the forming of the metal nanoparticles may include forming the metal nanoparticles on the dielectric thin film, the primary etching of the semiconductor substrate may include etching the dielectric thin film and the semiconductor substrate to pattern the dielectric thin film on the semiconductor substrate, the removing of the metal nanoparticles may include removing the metal nanoparticles formed on the dielectric thin film, and the secondary etching of the primarily etched semiconductor substrate may include etching the dielectric thin film patterned during the primary etching of the semiconductor substrate and the semiconductor substrate etched during the primary etching of the semiconductor substrate to form nanostructures.

In various exemplary embodiments of the present invention, the semiconductor substrate may include a crystalline silicon wafer, and the secondary etching of the primarily etched semiconductor substrate may include etching the dielectric thin film patterned during the primary etching of the semiconductor substrate and the semiconductor substrate etched during the primary etching of the semiconductor substrate to form silicon nanostructures having a pyramid shape or an elliptical hole shape.

In various exemplary embodiments of the present invention, the secondary etching of the primarily etched semiconductor substrate may include etching the dielectric thin film patterned during the primary etching of the semiconductor substrate and the semiconductor substrate etched during the primary etching of the semiconductor substrate to form nanostructures, and the nanostructures may be formed to have a depth of about 100 nm to about 1,000 nm.

In various exemplary embodiments of the present invention, the dielectric thin film may include a silicon-based nitride, a silicon-based oxide, a silicon oxynitride, or an aluminum-based oxide and is a type of single layer or multilayered thin film.

In various exemplary embodiments of the present invention, the dielectric thin film may have a thickness of about 50 nm to about 400 nm.

In various exemplary embodiments of the present invention, the metal nanoparticles may be formed of indium (In), tin (Sn), or an In—Sn alloy which has a melting point of about 250° C. or lower, and the forming of the metal nanoparticles may include forming the metal nanoparticles on the dielectric thin film at room temperature without an annealing process.

In various exemplary embodiments of the present invention, a nominal thickness of the metal nanoparticles may range from about 50 nm to about 200 nm.

In various exemplary embodiments of the present invention, the forming of the metal nanoparticles may include a bimodal growth process of simultaneously growing large metal nanoparticles and small metal nanoparticles.

In various exemplary embodiments of the present invention, a size of the small metal nanoparticles generated using the bimodal growth process may be more than about 0% of a size of the large metal nanoparticles and equal to or less than about 50% of the size of the large metal nanoparticles, and an average diameter of the large metal nanoparticles may be more than about 0 nm and equal to or less than about 1,000 nm.

In various exemplary embodiments of the present invention, the primary etching of the semiconductor substrate may include etching the dielectric thin film and the semiconductor substrate to pattern the dielectric thin film on the semiconductor substrate, and the dielectric thin film and the semiconductor substrate may be etched to have a depth of about 100 nm to about 500 nm.

In various exemplary embodiments of the present invention, the secondary etching of the primarily etched semiconductor substrate may include wet etching the semiconductor substrate by using the dielectric thin film, which is patterned during the primary etching of the semiconductor substrate, and a solution including a sodium hydroxide aqueous solution, a potassium hydroxide aqueous solution, a tetramethyl ammonium hydroxide (TMAH) aqueous solution, or a solution including a mixture of icosapentaenoic acid (IPA) additives, and forming nanostructures having a pyramid shape.

In various exemplary embodiments of the present invention, the secondary etching of the primarily etched semiconductor substrate may include wet etching the semiconductor substrate by using the dielectric thin film, which is patterned during the primary etching of the semiconductor substrate, and a solution including any one of hydrogen fluoride, nitric acid, acetic acid, and phosphoric acid or a mixture of at least two thereof, and forming nanostructures having an elliptical hole shape.

According to another aspect of the present invention, a semiconductor substrate manufactured using the above-described method of texturing the semiconductor substrate and a solar cell including the semiconductor substrate are provided.

Advantageous Effects

A semiconductor substrate textured according to the present invention can exhibit high light absorptance due to low reflectance of incident light, and have high charge collection efficiency because a rate of increase in surface area is low during a texturing process. In particular, the semiconductor substrate textured according to the present invention is effective in maximizing light absorption of an ultrathin wafer-based solar cell.

According to the present invention, photoelectric efficiency can be improved by increasing light absorptance of an ultrathin silicon solar cell, and it is possible to manufacture a highly efficient ultrathin solar cell having low power generation costs.

According to the present invention, it is possible to manufacture a lightweight and highly efficient silicon solar cell having mechanically flexible characteristics.

According to the present invention, a method of texturing a semiconductor substrate, which is economical and applicable to a full-wafer-scale large-area process, can be provided. A semiconductor substrate manufactured using the method can have high light absorptance and be applied to an ultrathin solar cell.

It should be understood that effects of the present invention are not limited to the above-described effects and include all effects that may be inferred from the detailed description of the present invention or the composition of the present invention set forth in the claims.

MODES OF THE INVENTION

Figure 1:
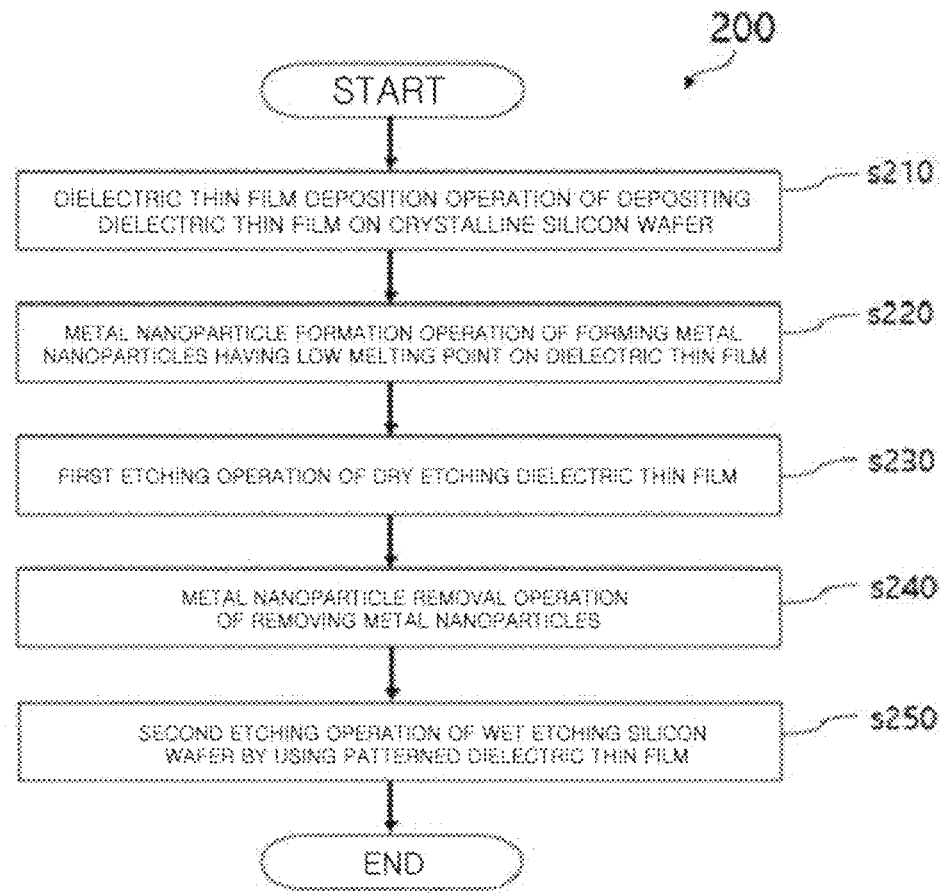
FIG. 1 is a flowchart of processes of a method of texturing a semiconductor substrate according to an exemplary embodiment of the present invention.

Hereinafter, the present invention will be described in detail with reference to the accompanying drawings. However, the present invention may be embodied in many different forms and is not to be construed as limited to embodiments set forth herein. It should also be understood that the appended drawings are intended to facilitate the embodiments disclosed herein, and the present invention includes all modifications, equivalents, and alternatives falling within the scope of the appended claims. Descriptions of components and processing techniques that are irrelevant to the embodiments of the present invention will be omitted for brevity. Sizes and shapes of respective components shown in the drawings may be variously modified, and like reference numerals refer to like elements throughout the specification. Terms such as "step," "operation," and "process" for components used in the following descriptions are given or used interchangeably in consideration only of ease of specification and do not have distinct meanings or functions in themselves. Further, in the following description of the embodiments set forth herein, detailed descriptions of well-known components and processing techniques will be omitted so as not to unnecessarily obscure the embodiments of the present invention.

As used herein, it should be understood that when an element is referred to as being "connected to" ("coupled to," "in contact with," "bonded to," or "combined with") another element, the element can be "directly connected to" ("coupled to," "in contact with," "bonded to," or "combined with") the other element or "indirectly connected to" ("coupled to," "in contact with," "bonded to," or "combined with") the other element by another intervening element. As used herein, when a portion is referred to as "comprising" (or "including") an element, the element can further "comprise" (or "include") other elements and yet other elements are not excluded unless specifically described otherwise.

The terminology used herein to describe embodiments of the invention is not intended to limit the scope of the invention. Elements of the invention referred to in the singular may number one or more unless the context clearly indicates otherwise. It should be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

FIG. 1 is a flowchart of processes of a method of texturing a semiconductor substrate according to an exemplary embodiment of the present invention (hereinafter, referred to as a "method 200 of texturing a semiconductor substrate").

As shown in FIG. 1, the method 200 of texturing a semiconductor substrate may include a dielectric thin film deposition operation S210 of depositing a dielectric thin film on a semiconductor substrate, a metal nanoparticle formation operation S220 of forming metal nanoparticles on the dielectric thin film, a first etching operation S230 of etching the dielectric thin film, a metal nanoparticle removal operation S240 of removing the metal nanoparticles, and a second etching operation S250 of etching the semiconductor substrate by using the dielectric thin film patterned in the first etching operation S230 and forming a nanostructure.

Here, since the dielectric thin film deposition operation S210 of depositing the dielectric thin film on the semiconductor substrate is not an essential procedure, the operation S210 may be omitted. That is, the method 200 of texturing a semiconductor substrate may include the metal nanoparticle formation operation S220 of forming metal nanoparticles on a semiconductor substrate, the first etching operation S230 of etching the semiconductor substrate, the metal nanoparticle removal operation S240 of removing the metal nanoparticles, and the second etching operation S250 of etching the semiconductor substrate etched in the first etching operation S230 and forming a nanostructure.

Hereinafter, detailed processes of operations included in the method 200 of texturing a semiconductor substrate will be described in detail with reference to FIGS. 2 to 6.

Figure 2:
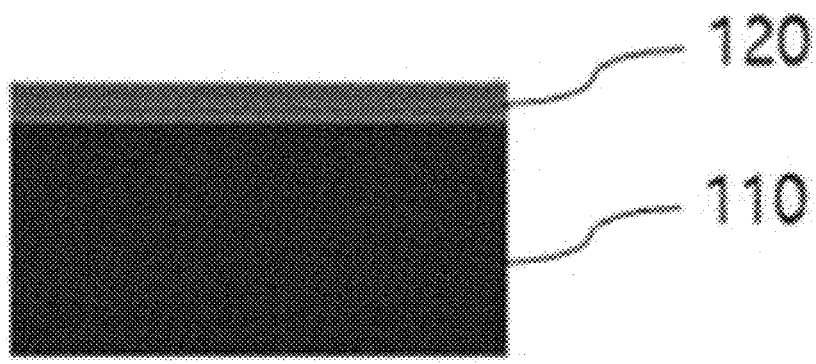
FIGS. 2 to 6 are flowcharts of detailed sequential processes of the method of texturing a semiconductor substrate shown in FIG. 1.
Figure 3:
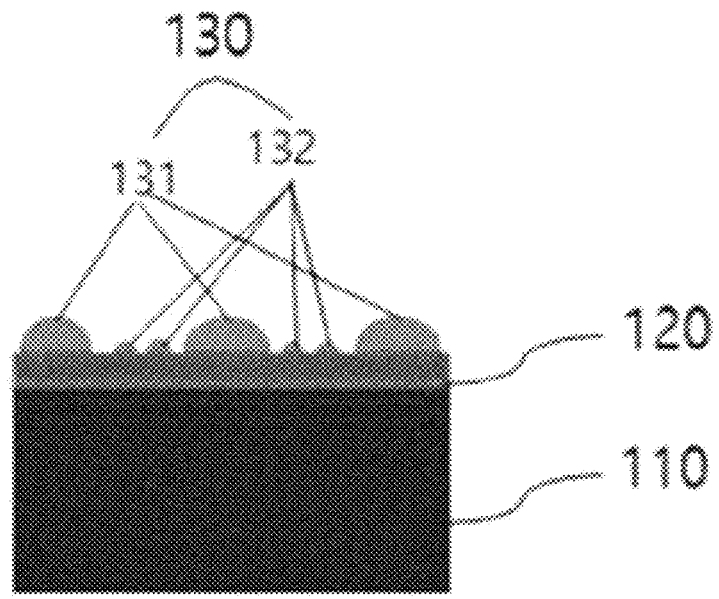
Figure 4:
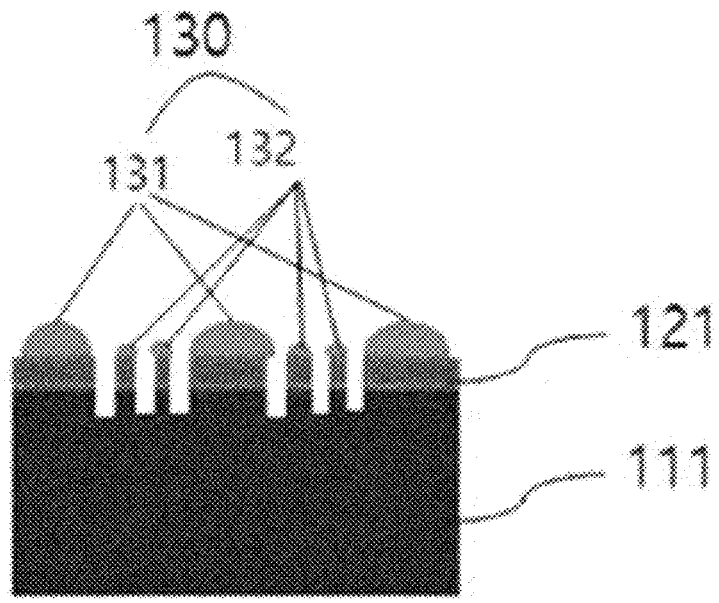
Figure 5:
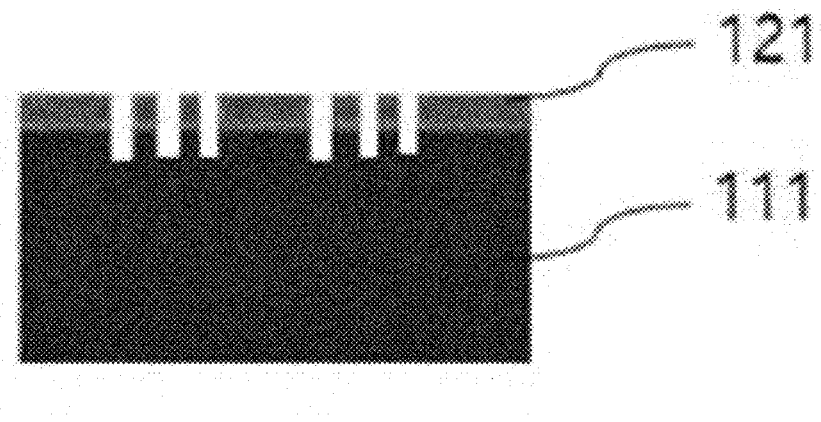

FIGS. 2 to 6 are flowcharts of detailed sequential processes of the method 200 of texturing a semiconductor substrate. FIG. 2 illustrates the dielectric thin film deposition operation S210, FIG. 3 illustrates the metal nanoparticle formation operation S220, FIG. 4 illustrates the first etching operation S230, FIG. 5 illustrates the metal nanoparticle removal operation S240, and FIG. 5 illustrates the second etching operation S250.

Referring to FIG. 2, the dielectric thin film deposition operation S210 may refer to an operation of depositing a dielectric thin film 120 on a semiconductor substrate 110.

The semiconductor substrate 110 may include at least one selected from the group consisting of silicon (Si), germanium (Ge), gallium arsenide (GaAs), and indium gallium arsenide (InGaAs), but the semiconductor substrate 110 is not limited thereto and may be formed of various materials. For example, the semiconductor substrate 110 may be a crystalline silicon wafer, such as a single crystalline silicon wafer or a polycrystalline silicon wafer, which is formed of silicon (Si).

Further, the dielectric thin film 120 may be a thin film formed of a silicon-based nitride ($SiN_x$), a silicon-based oxide ($SiO_x$), a silicon oxynitride ($SiO_xN_y$), or an aluminum-based oxide ($AlO_x$). The dielectric thin film 120 may be implemented as a type of single layer or multilayered thin film. In addition, the dielectric thin film 120 may be formed to a thickness of about 50 nm to about 400 nm, but the thickness of the dielectric thin film 120 is not limited thereto.

Referring to FIG. 3, the metal nanoparticle formation operation S220 may refer to an operation of forming metal nanoparticles 130 on the dielectric thin film 120.

The metal nanoparticles 130 may be formed of indium (In), tin (Sn), or an alloy (In—Sn alloy) thereof which has a melting point of about 250° C. or lower. Since the metal nanoparticles 130 are formed of a metal having a low melting point, the metal nanoparticle formation operation S220 using the metal having the low melting point may be performed under a room-temperature condition without an additional annealing process.

Furthermore, the metal nanoparticles 130 may be formed to a nominal thickness of about 50 nm to about 200 nm to synthesize nanoscale particles. For example, the metal nanoparticles 130 may be formed of indium (In) to a nominal thickness of about 150 nm.

In addition, the metal nanoparticle formation operation S220 may show bimodal growth behavior by which large metal nanoparticles 131 and small metal nanoparticles 132 are simultaneously grown. Accordingly, the metal nanoparticle formation operation S220 may include a bimodal growth process.

A size of the small metal nanoparticles 132 generated using the bimodal growth process may be more than about 0% a size of the large metal nanoparticles 131 and may be equal to or less than about 50% the size of the large metal nanoparticles 131. Further, the size of the large metal nanoparticles 131 may be more than 0 nm to equal to or less than about 1000 nm based on an average diameter In the metal nanoparticle formation operation S220, since the large metal nanoparticles 131 and the small metal nanoparticles 132 are grown simultaneously using the bimodal growth process, light absorptance of the semiconductor substrate formed in the metal nanoparticle formation operation S220 and a solar cell may be further increased.

Referring to FIG. 4, the first etching operation S230 may be an operation of etching the dielectric thin film 120. For example, the first etching operation S230 may include dry etching the dielectric thin film 120. Further, the first etching operation S230 may include a dry anisotropy etching of the dielectric thin film 120 by using any one of a gas mixture of carbon tetrafluoride ($CF_4$), oxygen ($O_2$), and fluoroform ($CHF_3$), a gas mixture of sulfur hexafluoride ($SF_6$) and oxygen ($O_2$), or a gas mixture of chlorine ($Cl_2$) and argon (Ar).

In addition, the first etching operation S230 may include etching the dielectric thin film 120 to a depth of about 110 nm to about 500 nm.

As a result of the first etching operation S230, the dielectric thin film 120 may be patterned on the semiconductor substrate 110, and the dielectric thin film 120 and the semiconductor substrate 110 may become a dielectric thin film 121 and a second semiconductor substrate 111 having etched portions, respectively.

Referring to FIG. 5, the metal nanoparticle removal operation S240 may be an operation of removing the metal nanoparticles 130 present on the dielectric thin film 121 after the first etching operation S230.

The metal nanoparticle removal operation S240 may be an operation of removing the metal nanoparticles 130 by using an acid aqueous solution including any one of hydrogen fluoride (HF), hydrogen chloride (HCl), and nitric acid ($HNO_3$) or a mixture of at least two thereof.

Figure 6:
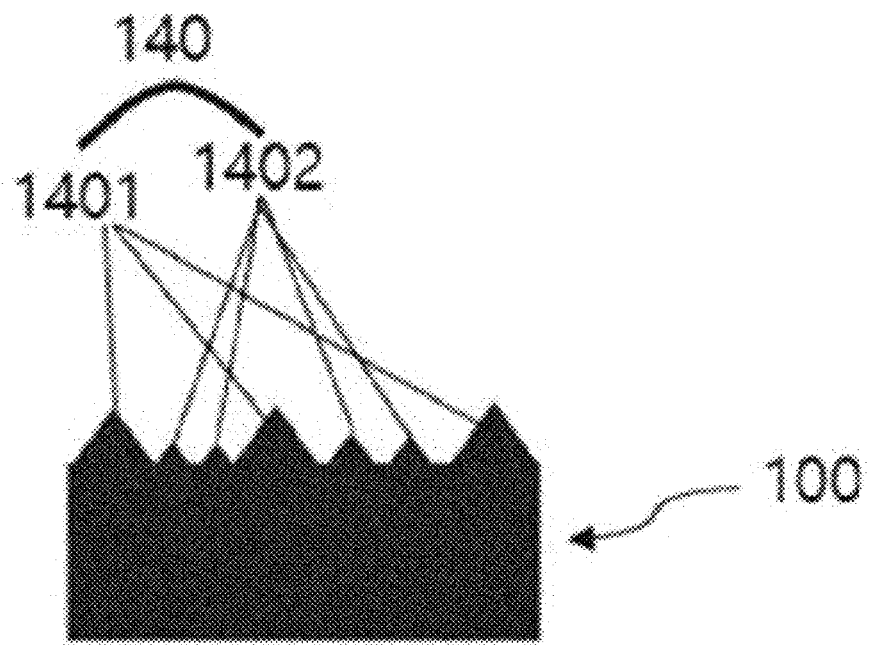

Referring to FIG. 6, the second etching operation S250 may be a process of forming a nanostructure 140 by etching the dielectric thin film 121 patterned in the first etching operation S230 and the semiconductor substrate 111 etched in the first etching operation S230. As a result of the second etching operation S250, the semiconductor substrate 110 having the nanostructure 140 may be formed.

Further, in the second etching operation S250, the nanostructure 140 may be etched to a depth of about 100 nm to about 1,000 nm.

The nanostructure 140 formed in the second etching operation S250 may be formed to include a large-scale nanostructure 1401 including a plurality of large-scale holes having a relatively large size and a small-scale nanostructure 1402 including a plurality of small-scale holes having a relatively small size.

In addition, the second etching operation S250 may be an operation of wet etching the dielectric thin film 121 patterned in the first etching operation S230 and the semiconductor substrate 111 etched in the first etching operation S230 by using a sodium hydroxide (NaOH) aqueous solution, a potassium hydroxide (KOH) aqueous solution, a tetramethyl ammonium hydroxide (TMAH) aqueous solution, or a solution including a mixture of icosapentaenoic acid (IPA) additives and forming a pyramid-type nanostructure. In this case, the wet etching process used in the second etching operation S250 may be an anisotropic etching process.

Furthermore, the second etching operation S250 may be an operation of wet etching the dielectric thin film 121 patterned in the first etching operation S230 and the semiconductor substrate 111 etched in the first etching operation S230 by using a solution including any one of hydrogen fluoride (HF), nitric acid ($HNO_3$), acetic acid, and phosphoric acid ($H_3PO_4$) or a mixture of at least two thereof. In this case, the wet etching process used in the second etching operation S250 may be an isotropic etching process.

As a result of the above-described operations S210 to S250, the semiconductor substrate 100 shown in FIG. 6 may be manufactured.

Figure 7:
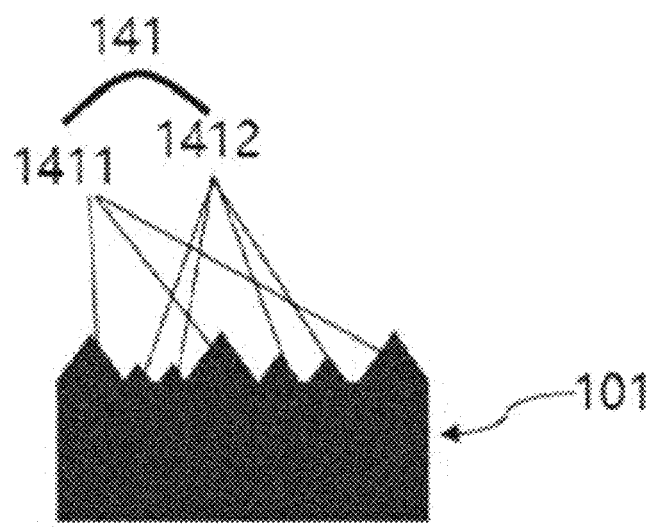
FIG. 7 is a cross-sectional view of a semiconductor substrate having a pyramid-type nanostructure formed using the method of texturing a semiconductor substrate shown in FIGS. 1 to 6.
Figure 8:
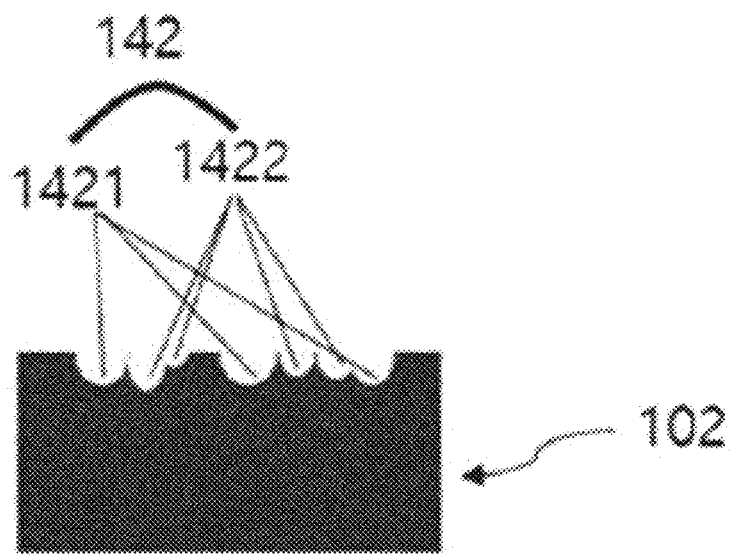
FIG. 8 is a cross-sectional view of a semiconductor substrate having an elliptical-hole-type nanostructure formed using the method of texturing a semiconductor substrate shown in FIGS. 1 to 6.

FIGS. 7 and 8 are cross-sectional views of semiconductor substrates generated using the method 200 of texturing a semiconductor substrate.

As shown in FIG. 7, a semiconductor substrate 101 having pyramid-type nanostructures 141 may be formed using the method 200 of texturing a semiconductor substrate.

Specifically, in the second etching operation S250 described with reference to FIG. 6, when the dielectric thin film 121 patterned in the first etching operation S230 and the semiconductor substrate 111 etched in the first etching operation S230 are wet etched using a sodium hydroxide (NaOH) aqueous solution, a potassium hydroxide (KOH) aqueous solution, a tetra methyl ammonium hydroxide (TMAH) aqueous solution, or a solution including a mixture of icosapentaenoic acid (IPA) additives, the semiconductor substrate 101 having the pyramid-type nanostructure 141 shown in FIG. 7 may be formed. In this case, an anisotropic etching process may be used.

In addition, as shown in FIG. 7, the pyramid-type nanostructure 141 formed in the second etching operation S250 described with reference to FIG. 6 may be formed to include a large-scale pyramid nanostructure 1411 including a plurality of pyramid nanostructures having a relatively large size and a small-scale pyramid nanostructure 1412 including a plurality of pyramid structures having a relatively small size.

As shown in FIG. 8, a semiconductor substrate 102 having an elliptical-hole-type nanostructure 142 may be formed using the method 200 of texturing a semiconductor substrate.

Specifically, in the second etching operation S250 described with reference to FIG. 6, when the dielectric thin film 121 patterned in the first etching operation S230 and the semiconductor substrate 111 etched in the first etching operation S230 are wet etched using a solution including any one of hydrogen fluoride (HF), nitric acid (HNO$_3$), acetic acid, and phosphoric acid (H$_3$PO$_4$) or a mixture of at least two thereof, the semiconductor substrate 102 having the elliptical-hole-type nanostructure 142 may be formed. In this case, an isotropic etching process may be used.

Further, as shown in FIG. 8, the elliptical-hole-type nanostructure 141 formed in the second etching operation S250 described with reference to FIG. 6 may be formed to include a large-scale elliptical nanostructure 1421 including a plurality of elliptical holes having a relatively large size and a small-scale elliptical nanostructure 1422 including a plurality of elliptical holes having a relatively small size.

A solar cell that may be provided according to various embodiments of the present invention may include the semiconductor substrate 101 of FIG. 7 or the semiconductor substrate 102 of FIG. 8. Thus, the solar cell that may be provided according to various embodiments of the present invention may be improved in light absorptance and photoelectric efficiency.

Figure 9:
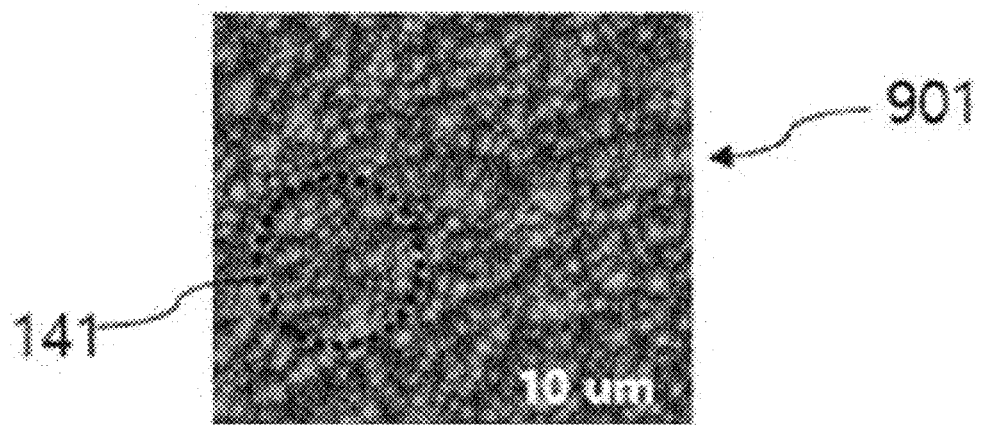
FIG. 9 is a diagram of a pyramid-type nanostructure formed on a surface of the semiconductor substrate shown in FIG. 7.

FIG. 9 is a diagram of a pyramid-type nanostructure 141 formed on a surface of the semiconductor substrate 101 of FIG. 7. Reference numeral 901 denotes the surface of the semiconductor substrate 101 of FIG. 7.

As shown in FIG. 9, when an anisotropic wet etching process is performed in the second etching operation S250 described with reference to FIG. 6, a semiconductor substrate having the surface 901 including the pyramid-type nanostructure 141 having a plurality of pyramid structures may be formed.

Figure 10:
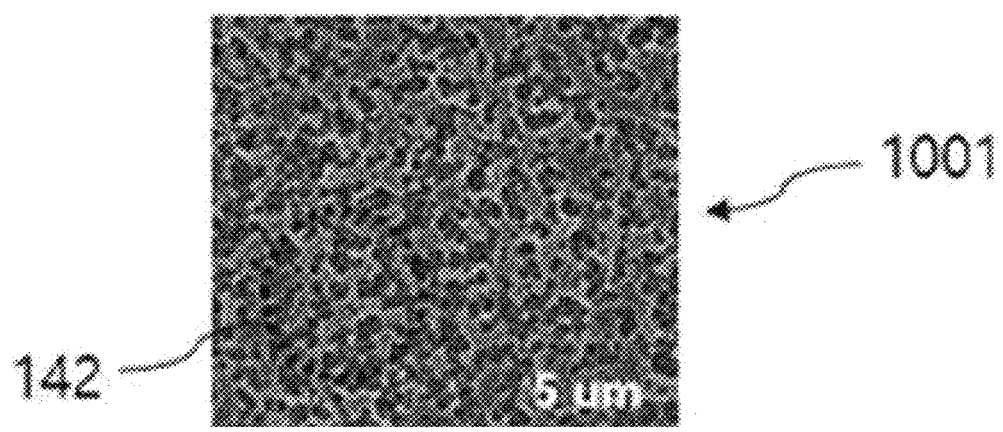
FIG. 10 is a diagram of an elliptical-hole-type nanostructures formed on a surface of the semiconductor substrate shown in FIG. 8.

FIG. 10 is a diagram of the elliptical-hole-type nanostructure 142 formed on a surface of the semiconductor substrate 102 of FIG. 8. Reference numeral 1001 denotes the surface of the semiconductor substrate 102 of FIG. 8.

As shown in FIG. 10, when an isotropic wet etching process is performed in the second etching operation S250 described with reference to FIG. 6, a semiconductor substrate having the surface 1001 including the elliptical-hole-type nanostructure 142 having a plurality of elliptical holes may be formed.

Figure 11:
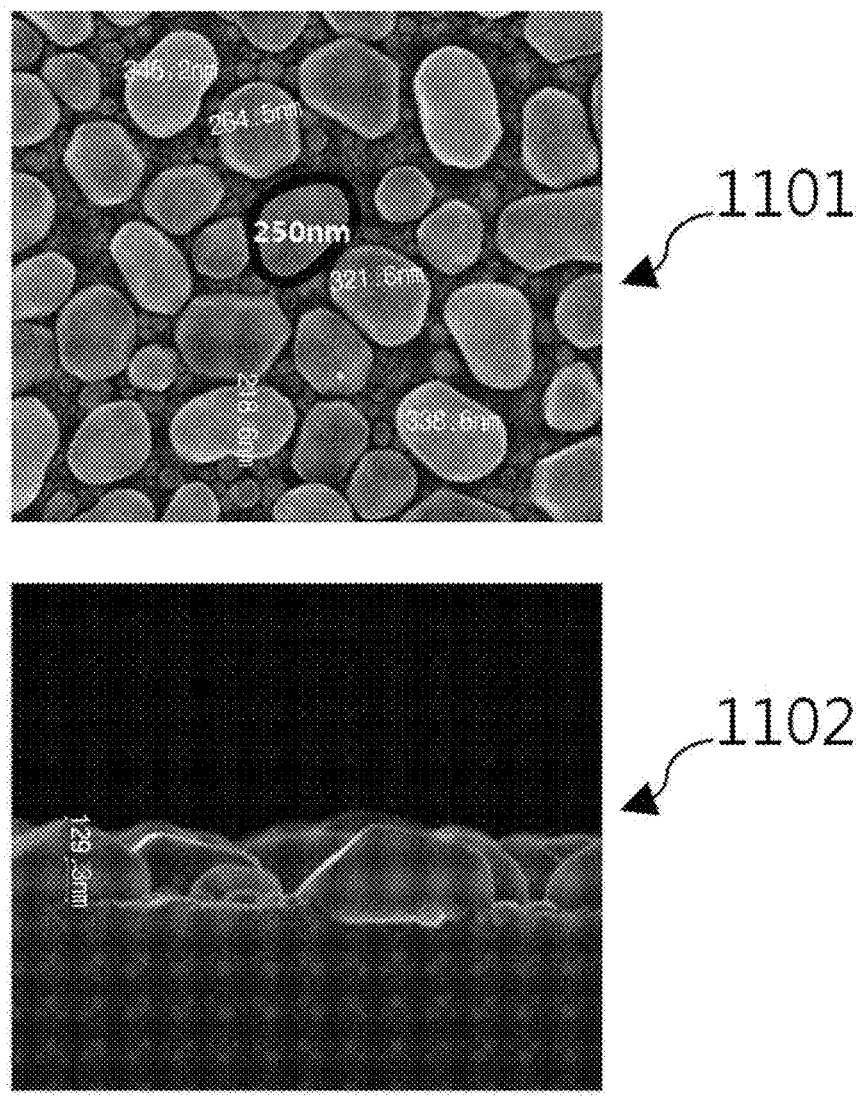
FIGS. 11 to 13 are diagrams for explaining an effect of easily controlling a size of a nanostructure formed according to an exemplary embodiment of the present invention.
Figure 12:
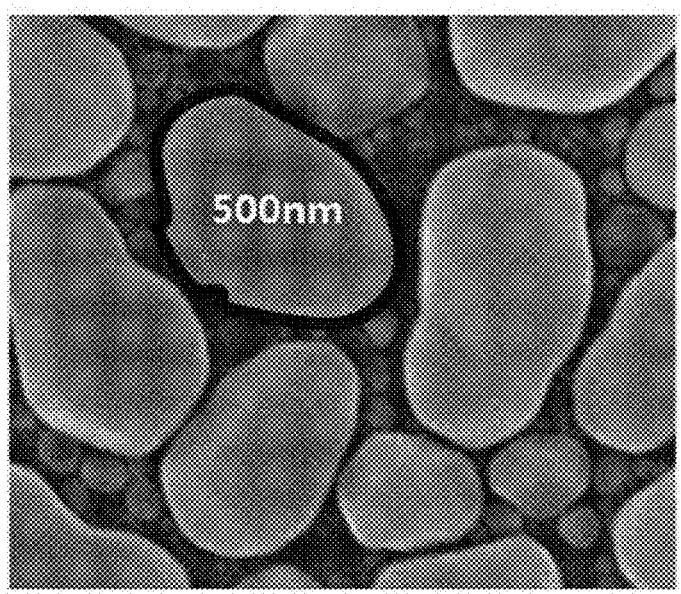
Figure 12:
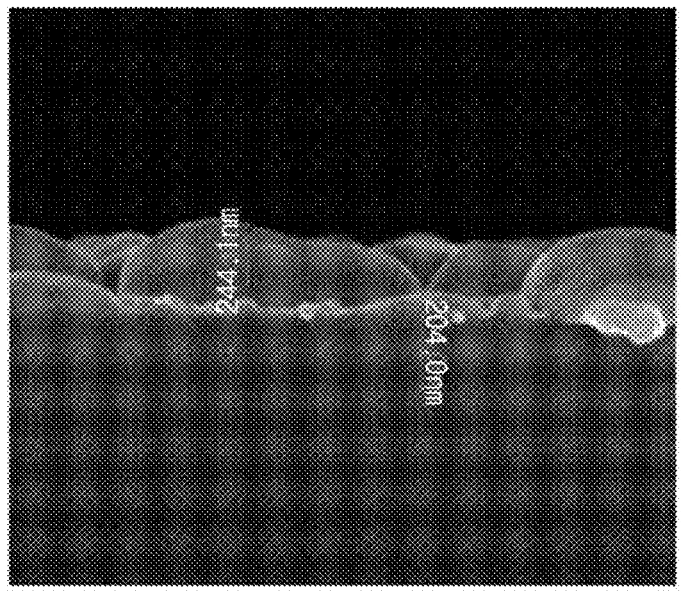
Figure 13:
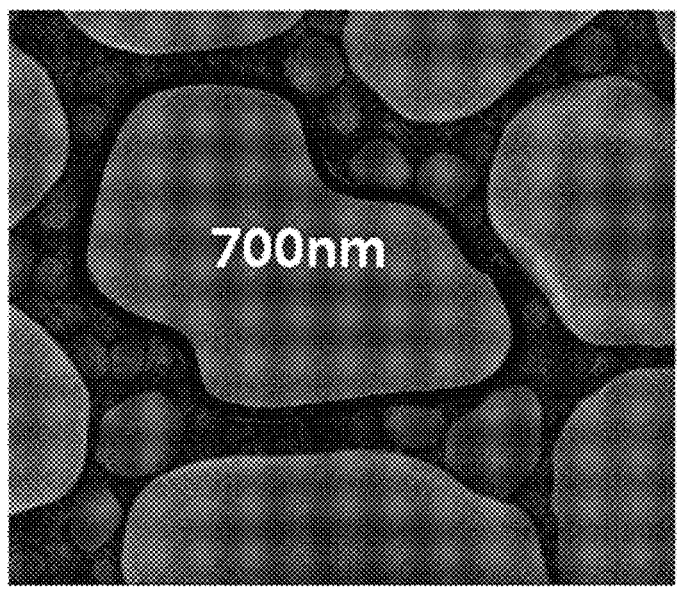
Figure 13:
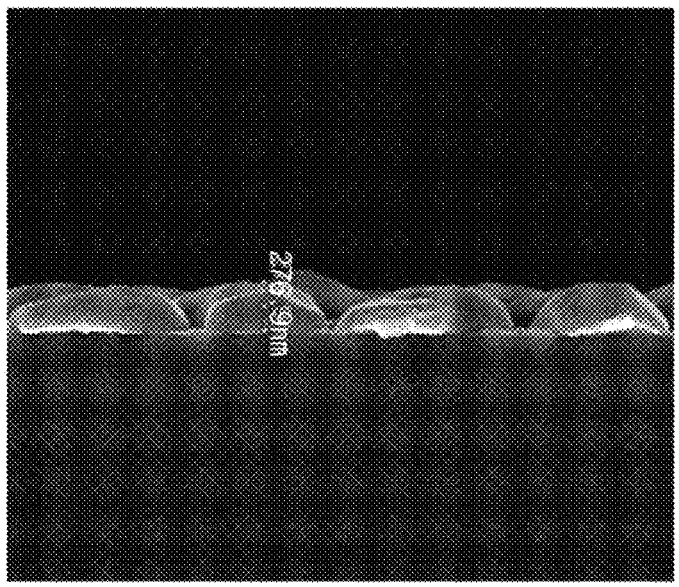

FIGS. 11 to 13 are diagrams for explaining an effect of easily controlling a size of the nanostructure 140 formed according to an exemplary embodiment of the present invention.

As described above, the metal nanoparticles 130 may include metal particles having a low melting point, and the metal nanoparticle formation operation S220 may be performed using a physical vapor deposition (PVD) method at a temperature of about 250° C. or lower. Accordingly, the metal nanoparticles 130 may show bimodal growth behavior, and a size of the metal nanoparticles 130 may be controlled in proportion to a nominal thickness.

FIG. 11 is a schematic diagram of a nanostructure formed when indium (In) having a nominal thickness of, for example, about 50 nm is used for metal nanoparticles. Reference numeral 1101 denotes a surface of a corresponding nanostructure, and 1102 denotes a schematic cross-sectional view of the corresponding nanostructure.

FIG. 12 is a schematic diagram of a nanostructure formed when indium having a nominal thickness of, for example, about 100 nm is used for metal nanoparticles. Reference numeral 1201 denotes a surface of a corresponding nanostructure, and 1202 denotes a schematic cross-sectional view of the corresponding nanostructure.

FIG. 13 is a schematic diagram of a nanostructure formed when indium having a nominal thickness of, for example, about 150 nm is used for metal nanoparticles. Reference numeral 1301 denotes a surface of a corresponding nanostructure, and 1302 denotes a schematic cross-sectional view of the corresponding nanostructure.

Referring to FIG. 11, when a texturing process is performed using indium having the nominal thickness of about 50 nm for the metal nanoparticles, sizes of the metal nanoparticles may be controlled to have an average diameter of about 250 nm.

Referring to FIG. 12, when a texturing process is performed using indium having the nominal thickness of about 100 nm for the metal nanoparticles, sizes of the metal nanoparticles may be controlled to have an average diameter of about 500 nm.

Referring to FIG. 13, when a texturing process is performed using indium having the nominal thickness of about 150 nm for the metal nanoparticles, sizes of the metal nanoparticles may be controlled to have an average diameter of about 750 nm.

Figure 14:
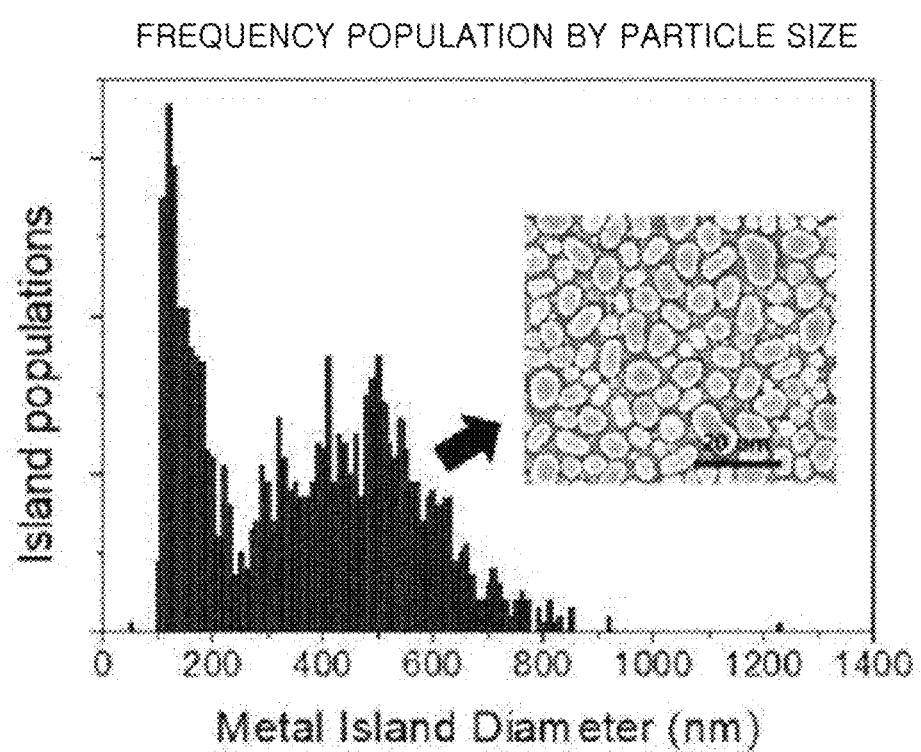
FIG. 14 is a graph of frequency populations relative to particle size, which illustrates examples of populations of large metal nanoparticles and small metal nanoparticles that are generated using a bimodal growth process according to an exemplary embodiment of the present invention.

FIG. 14 is a graph of frequency population (i.e., island population) relative to a particle size (i.e., a metal island diameter), which illustrates examples of populations of large metal nanoparticles and small metal nanoparticles that are generated using a bimodal growth process according to an exemplary embodiment of the present invention.

As described above, since the metal nanoparticle formation operation S220 shows bimodal growth behavior by which the large metal nanoparticles 131 and the small metal nanoparticles 132 are grown simultaneously, a multiscale texture structure may be formed.

In the case of the nanoscale structure, wavelength dependence of an amplified light-scattering sectional area may vary according to a size of structures due to the Mie scattering effect. Accordingly, when structures having various sizes are disposed on a substrate, a reflectance increase effect and a scattering amplification effect may be obtained in a wideband. As a result, light absorptance of a semiconductor substrate using a multiscale structure may be increased more effectively in the wideband.

When the bimodal growth process according to the exemplary embodiment of the present invention is performed as shown in FIG. 14, it can be seen that small metal nanoparticles having an average diameter of about 100 nm to about 200 nm and large metal nanoparticles having an average diameter of about 200 nm to about 800 nm are uniformly distributed.

Figure 15:
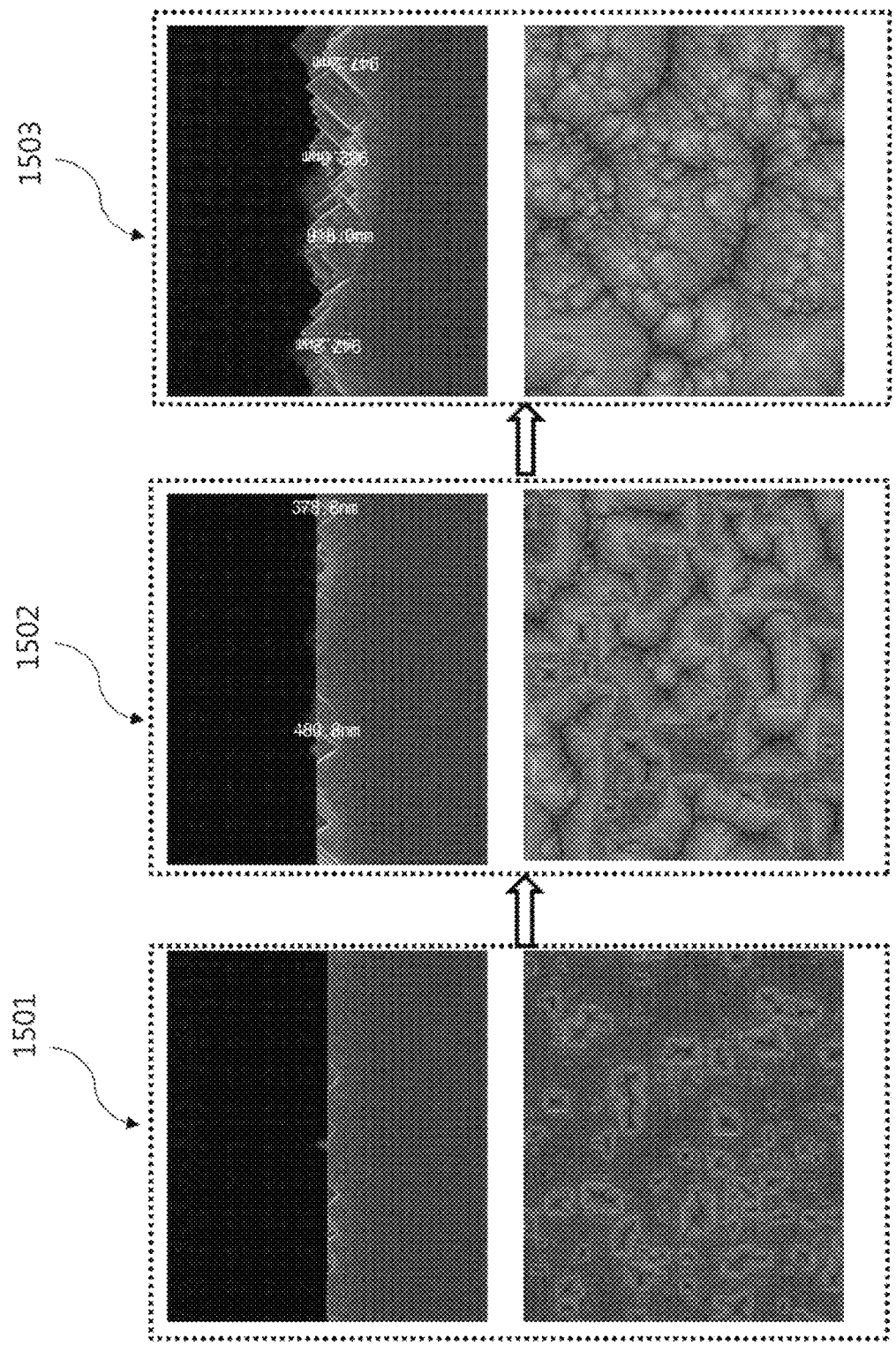
FIGS. 15 and 16 are diagrams for explaining nanostructures having multiscale texture structures formed by varying an etch time according to an exemplary embodiment of the present invention.
Figure 16:
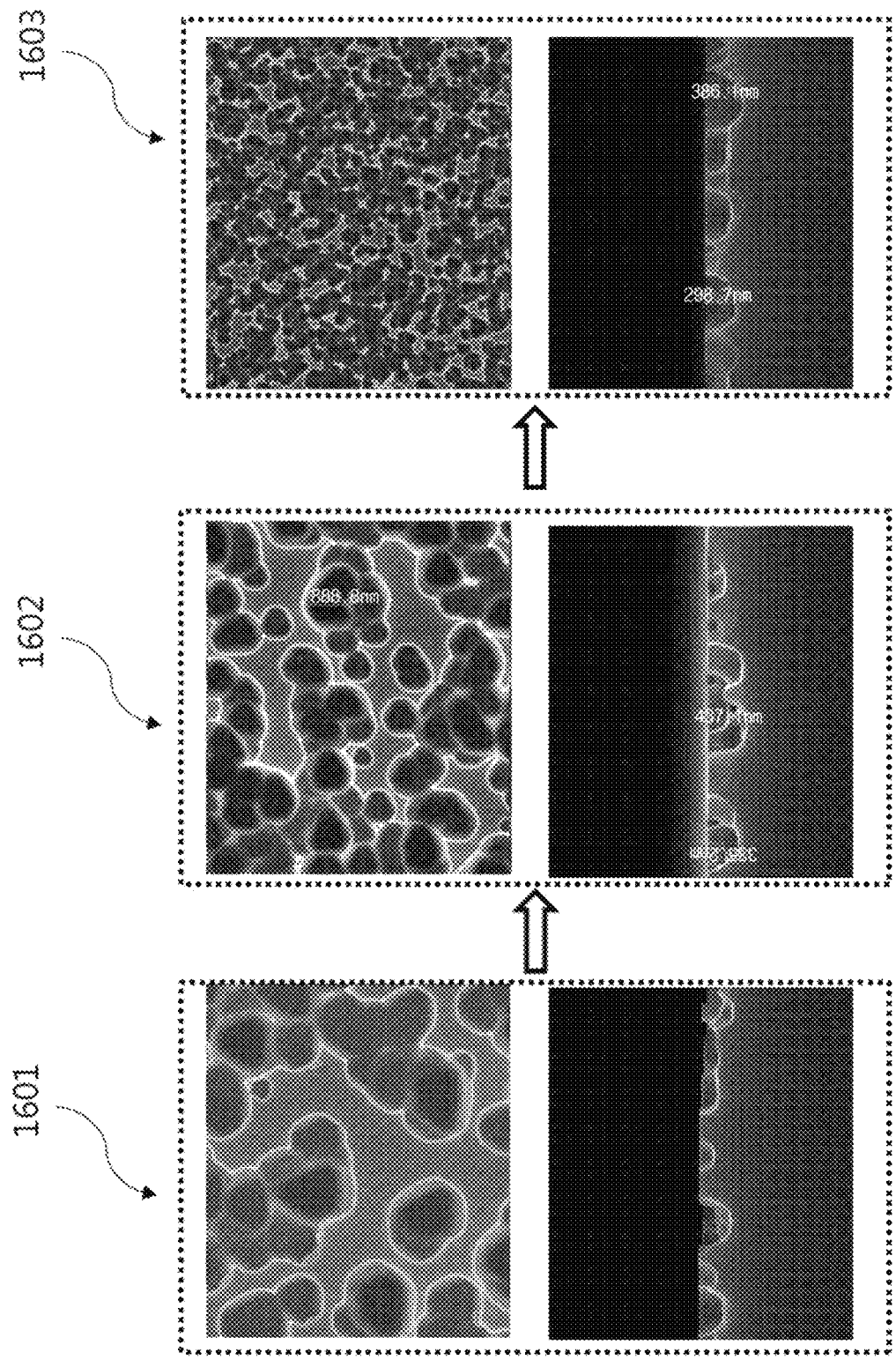

FIGS. 15 and 16 are diagrams for explaining nanostructures having multiscale texture structures formed by varying an etch time according to an exemplary embodiment of the present invention. As used herein, the term "texture structure" may collectively refer to a pattern or structure formed on a semiconductor substrate by using a texturing process.

FIG. 15 is a diagram of a silicon wafer including a nanostructure having a multiscale texture structure which is manufactured using indium (In) metal nanoparticles.

Specifically, FIG. 15 is a scanning electron microscope (SEM) photograph of a silicon wafer obtained by controlling an etching time during which the silicon wafer is etched using KOH (5 wt %)+IPA after a $SiO_x$ dielectric thin film having a thickness of about 200 nm and indium metal nanoparticles having a nominal thickness of about 100 nm are formed on the silicon wafer and the above-described RIE process is performed using $CF_4+O_2$.

Reference numeral 1501 illustrates a state of the silicon wafer after an etching time of about 10 minutes, 1502 illustrates a state of the silicon wafer after an etching time of about 19 minutes, and 1503 illustrates a state of the silicon wafer after an etching time of about 30 minutes. From 1501 to 1503, it can be seen that a multiscale nanostructure including a plurality of small-scale nanoholes and a plurality of large-scale nanoholes is formed.

FIG. 16 is a diagram of a silicon wafer including a multiscale nanostructure manufactured using indium metal nanoparticles.

Specifically, FIG. 16 is a SEM photograph of a silicon wafer obtained by controlling an etching time during which the silicon wafer is etched using an aqueous solution in which HF, $HNO_3$, and $HPO_3$ are mixed at a ratio of 1:5:30 after a $SiO_x$ dielectric thin film having a thickness of about 200 nm and indium metal nanoparticles having a nominal thickness of about 100 nm are formed on the silicon wafer and an RIE process is performed using $CF_4+O_2$.

Reference numeral 1601 illustrates a state of the silicon wafer after an etching time of about 3 minutes and 30 seconds, reference numeral 1602 illustrates a state of the silicon wafer after an etching time of about 6 minutes, and 1603 illustrates a state of the silicon wafer after an etching time of about 10 minutes. From 1601 to 1603, it can be seen that a multiscale nanostructure including a plurality of small-scale nanoholes and a plurality of large-scale nanoholes is formed.

Figure 17:
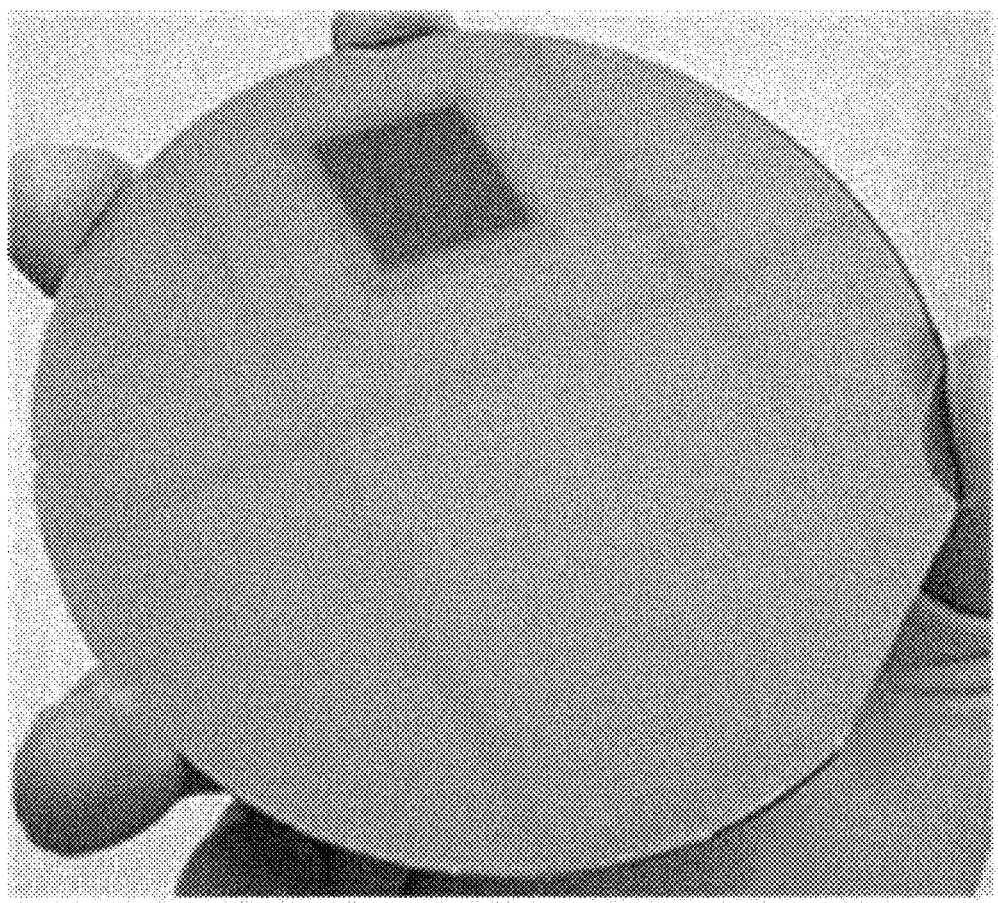
FIGS. 17 to 19 are diagrams for explaining how a method of texturing a semiconductor substrate according to an exemplary embodiment of the present invention is advantageous for a large-area wafer-scale process.
Figure 18:
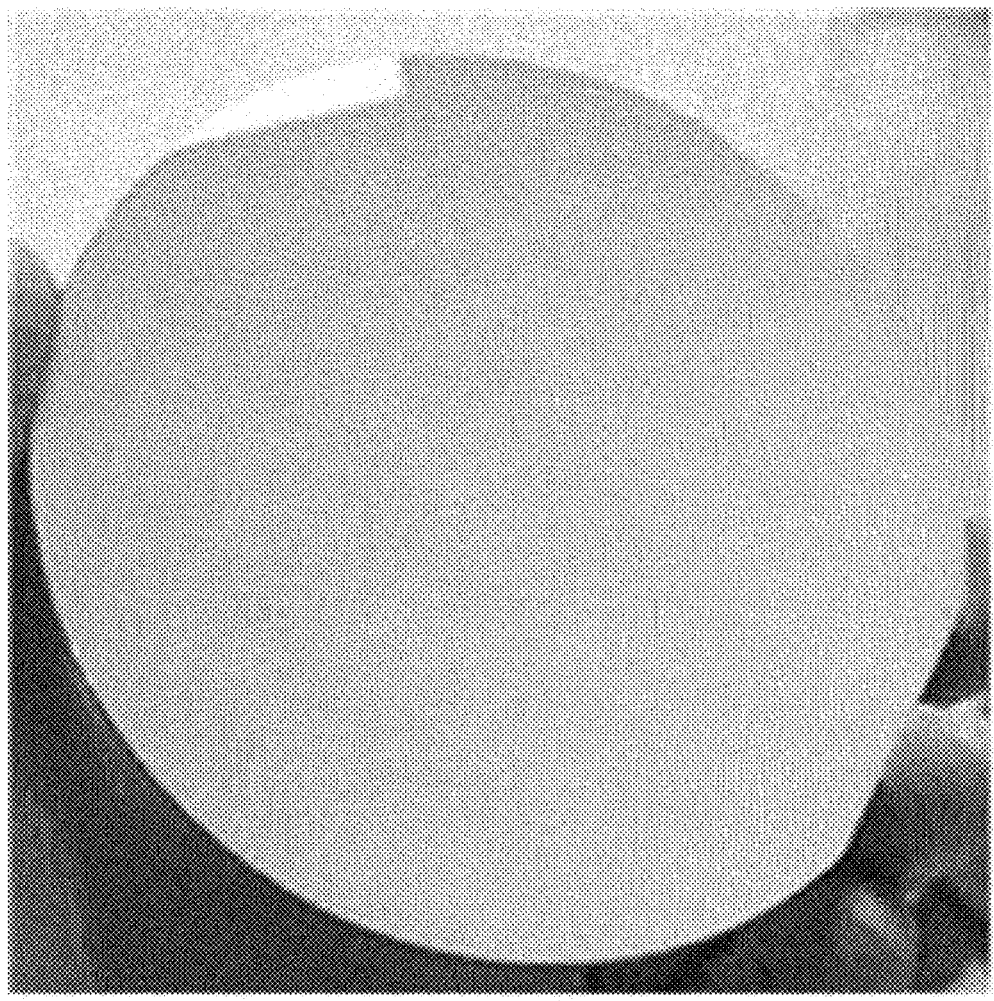
Figure 19:

FIGS. 17 to 19 are diagrams for explaining how the method 200 of texturing a semiconductor substrate is advantageous for a large-area wafer-scale process. FIGS. 17 to 19 show images of a 4-inch silicon wafer captured by a camera after indium is formed on the 4-inch silicon wafer by controlling indium to have a nominal thickness of about 50 nm, about 100 nm, and about 150 nm by using an electronic-beam (E-beam) evaporator.

FIG. 17 illustrates a state in which indium having a nominal thickness of about 50 nm is formed on a 4-inch silicon wafer. FIG. 18 illustrates a state in which indium having a nominal thickness of about 100 nm is formed on a 4-inch silicon wafer. FIG. 19 illustrates a state in which indium having a nominal thickness of about 150 nm is formed on a 4-inch silicon wafer. From FIGS. 17 to 19, it can be seen that metal nanoparticles formed of indium are very uniformly formed on the 4-inch silicon wafer.

Conventional nano-lithography techniques (e.g., nanoimprint, colloid lithography, and the like) have difficulties in being applied to a silicon-wafer-sized large-area process. However, according to various exemplary embodiments of the present invention, processes applicable to a large-area process may be performed at low cost.

Figure 20:
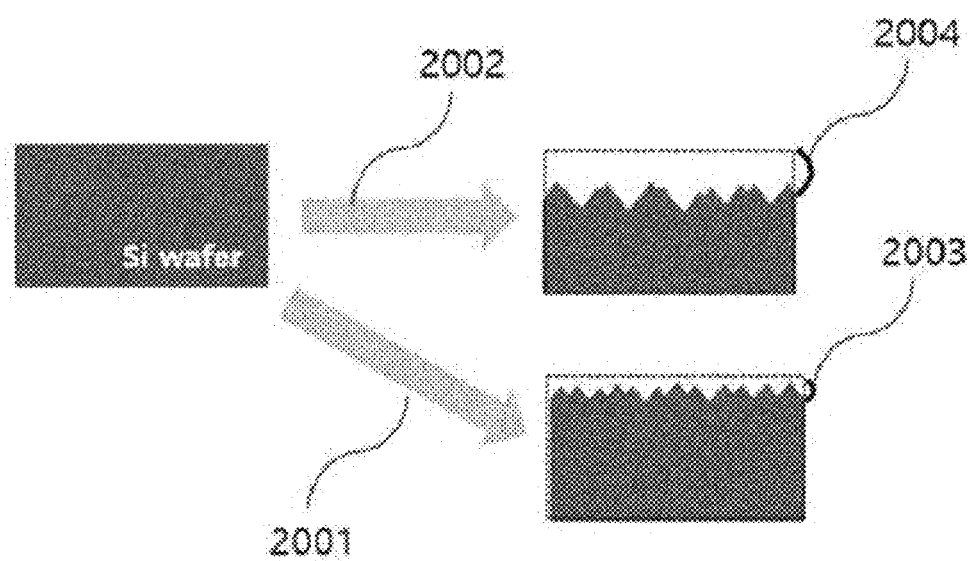
FIG. 20 is a diagram for explaining an effect of reducing a silicon loss by using a method of texturing a semiconductor substrate according to an exemplary embodiment of the present invention.

FIG. 20 is a diagram for explaining an effect of reducing a silicon loss by using the method 200 of texturing a semiconductor substrate.

Reference 2001 indicates an example of an experiment for examining the silicon loss by using the method 200 of texturing a semiconductor substrate. According to the experiment 2001, after a $SiO_x$ dielectric thin film having a thickness of about 200 nm and indium having a nominal thickness of about 100 nm were formed on a silicon wafer by using a plasma-enhanced chemical vapor deposition (PECVD) process, an RIE process was performed using $CF_4+O_2$ to pattern the $SiO_x$ dielectric thin film, and an experiment was conducted using the $SiO_x$ dielectric thin film as an etch mask. In this case, the silicon wafer was etched to a depth of about 200 nm, and uniformity of a subsequent wet etching process was improved due to the etching of the silicon wafer. Subsequently, a texturing process was performed using a KOH (5 wt %) 36 ml+IPA (13 ml) solution (a total of 400 ml) at a temperature of about 70° C. to form a pyramid-type nanostructure, and an etching time was controlled to be about 25 minutes. From the experiment 2001, it can be seen that a thickness of the silicon wafer consumed to form the pyramid-type nanostructure is about 640 nm on average.

In contrast, reference numeral 2002 indicates an example of a conventional experiment for manufacturing micropyramids without an etch mask. From the experiment 2002, it can be seen that a consumed silicon thickness is about 4.2 μm. Referring to the experiments 2001 and 2002, it can be seen that the process (refer to 2002) that did not use the etch mask causes about 7 or more times silicon material loss when compared with the process (refer to 2001) using the etch mask.

FIGS. 21 to 25 are diagrams showing results of analyzing reflectance of a substrate manufactured using the method 200 of texturing a semiconductor substrate.

Figure 21:
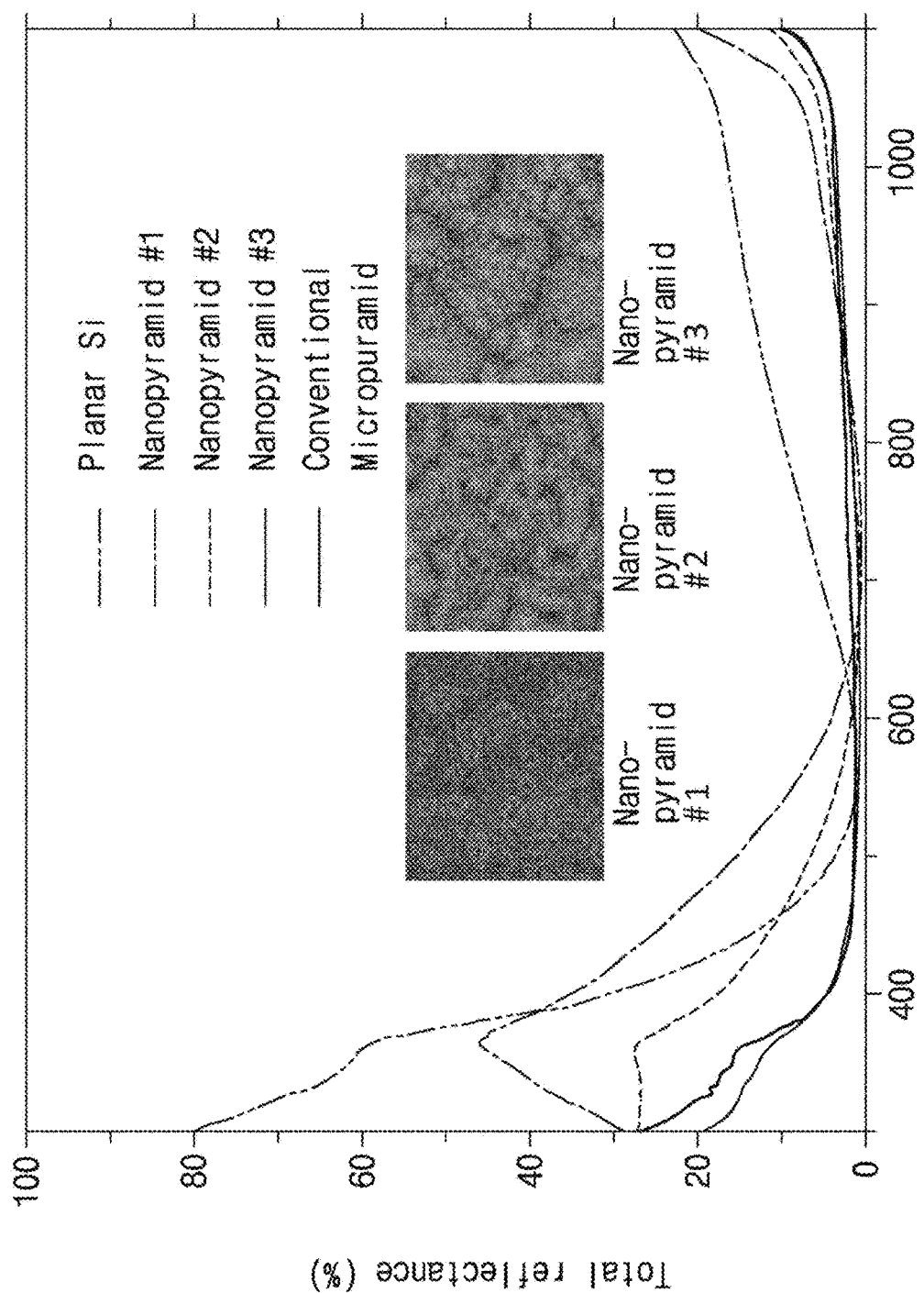
FIGS. 21 to 25 are diagrams showing results of analyzing reflectance of a substrate manufactured using a method of texturing a semiconductor substrate according to an exemplary embodiment of the present invention.

FIG. 21 is a graph of total reflectance relative to wavelength based on results obtained by using KOH+IPA to perform a texturing process to form a pyramid-type nanostructure after a $SiO_x$ dielectric thin film was deposited to a thickness of about 200 nm on a single crystalline silicon wafer through a PECVD process, indium metal nanoparticles were formed to a nominal thickness of about 100 nm, and the silicon wafer was etched to a depth of about 200 nm by performing an RIE process using $CF_4+O_2$. The following Table 1 shows some of results shown in the graph of FIG. 21.

TABLE 1

| Sample | (%) |
|---|---|
| Planar Si | 10.25 |
| Nanopyramid #1 | 9.57 |

TABLE 1-continued

| Sample | (%) |
|---|---|
| Nanopyramid #2 | 4.97 |
| Nanopyramid #3 | 1.98 |
| Conventional Micropyramid | 2.44 |

From the graph of FIG. 21 and Table 1, it can be ascertained that, with a texturing process time, a size of pyramids increases and total reflectance is reduced.

In the graph of FIG. 21, the nanopyramids #1, #2, and #3 show results obtained by performing the texturing process for about 10, 19, and 29 minutes, respectively.

Conventional micropyramids shown in the graph of FIG. 21 and Table 1 are generated on the basis of results obtained by using KOH+IPA to perform an etching process for about 40 minutes at a temperature of about 75° C. without using an etch mask. Total reflectance $R_w$ may be obtained as shown in the following equation 1. The total reflectance may be calculated by controlling a wavelength band to be in the range of about 350 nm to about 1,200 nm using standard solar light as a weighting factor.

$$R_W = \frac{\int_{350\ nm}^{1100\ nm} R(\lambda)I(\lambda)d}{\int_{350\ nm}^{1100\ nm} I(\lambda)d}. \tag{1}$$

Figure 22:
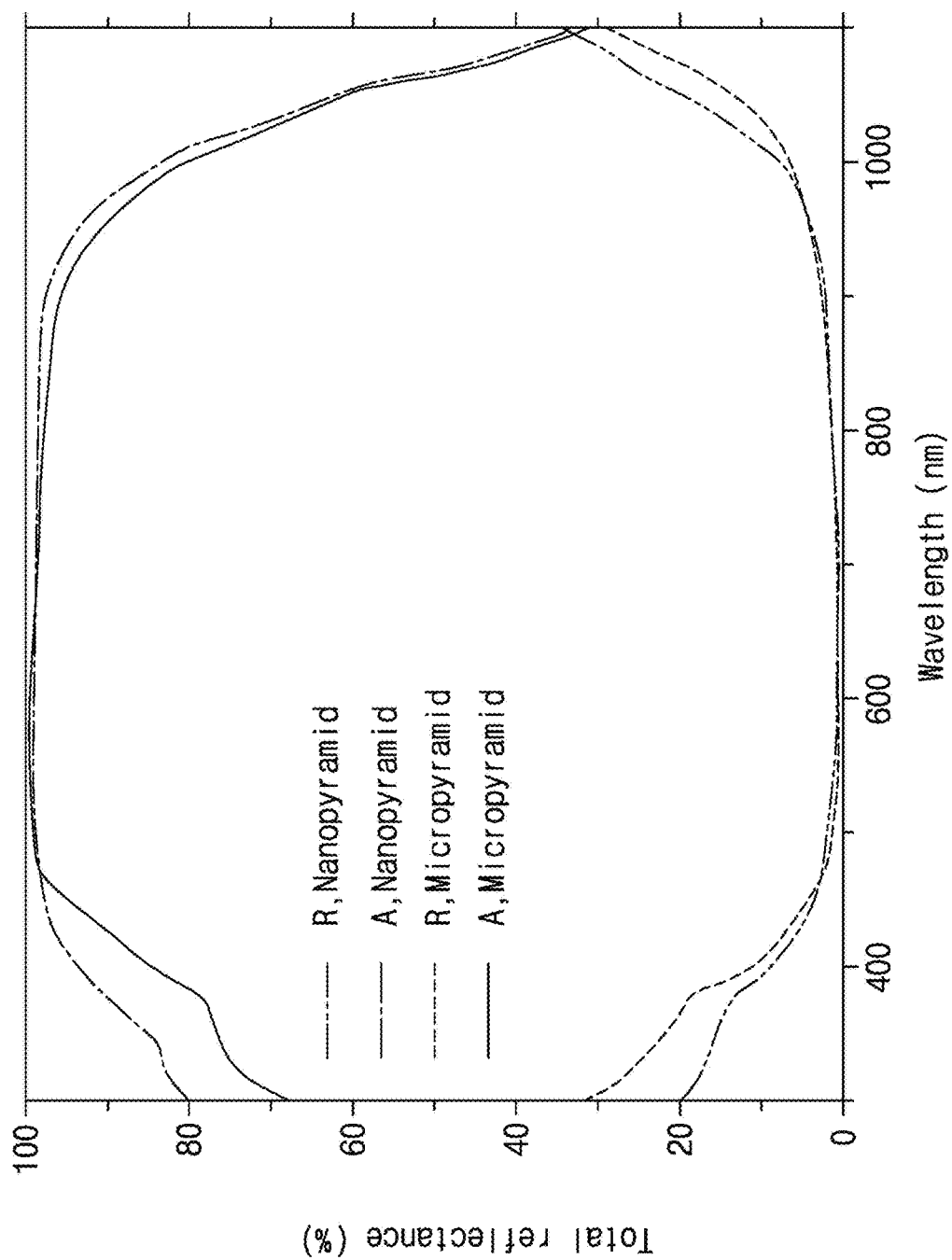

FIG. 22 is a graph showing measurement results of total reflectance relative to wavelength after a pyramid nanostructure (refer to Nanopyramids in FIG. 22) was textured on a silicon wafer by using the above-described method 200 of texturing a semiconductor substrate. For comparison, FIG. 22 includes results obtained by texturing a micropyramid structure (refer to micropyramids in FIG. 22) manufactured using a typical process. Further, the following Table 2 shows some of the results shown in the graph of FIG. 22. In FIG. 22, R, Nanopyramid may be an index of reflectance, and A, Nanopyramid may be an index of absorptance.

TABLE 2

| | (%) | $J_{max}$ |
|---|---|---|
| Nanopyramid | 3.29 | 40.3(95%) |
| Micropyramid | 4.40 | 40.2(95%) |

From the graph of FIG. 22 and Table 2, it can be seen that the reflectance $R_w$ of the wafer on which the nanopyramid structure was formed was about 3.29%. Assuming that all absorbed photons are converted into current, a maximum photocurrent value $J_{max}$ may be up to about 40.3 mA/cm², which is more than about 95% of the Lambertian limit, which is known as the theoretical maximum light absorptance. It is assumed that the maximum photocurrent that may be obtained when a front surface of a light absorber is an anti-reflection Lambertian surface and a reflector having a reflectance of about 100% is disposed on a rear surface of the light absorber, which is the Lambertian limit in a calculation process.

Figure 23:
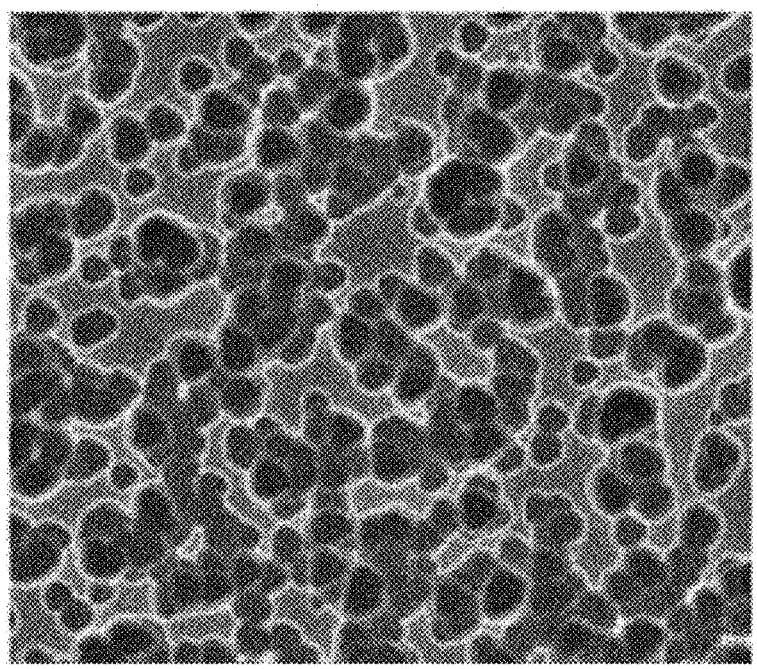
Figure 23:
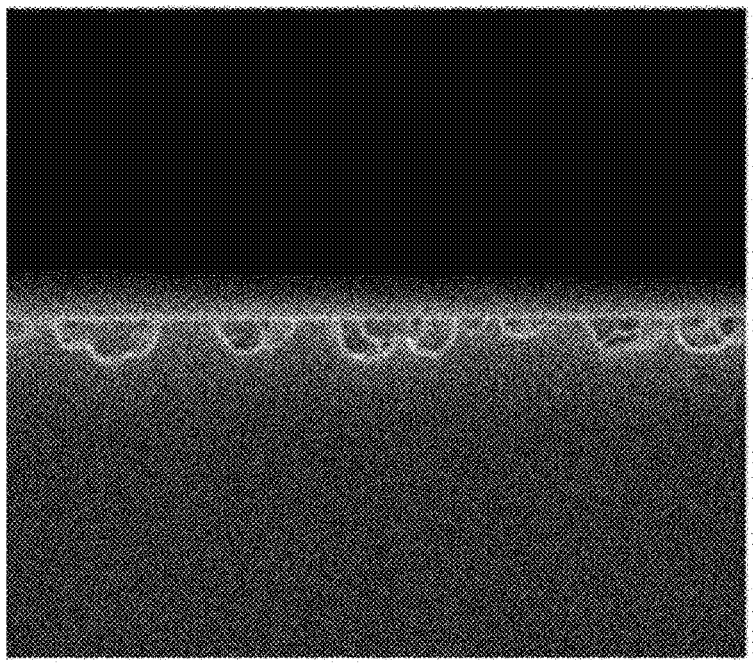
Figure 24:
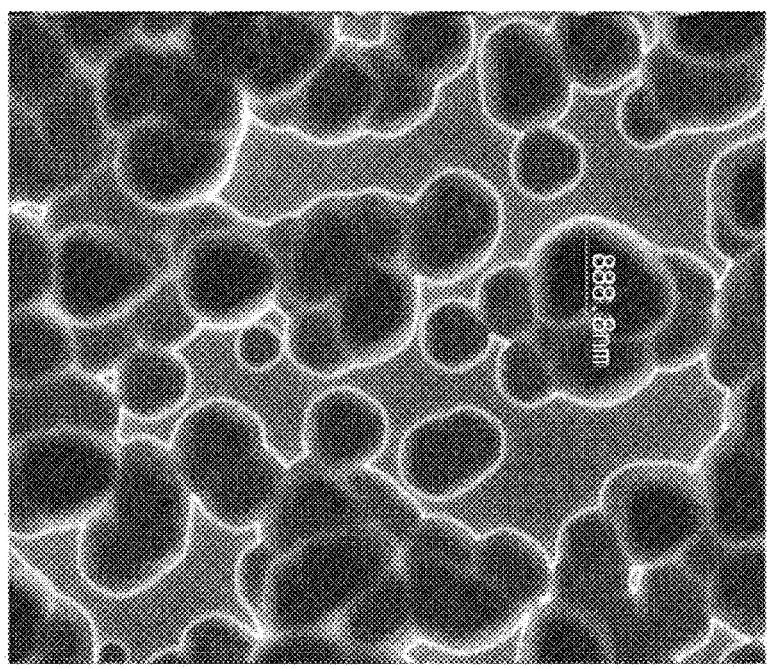
Figure 24:
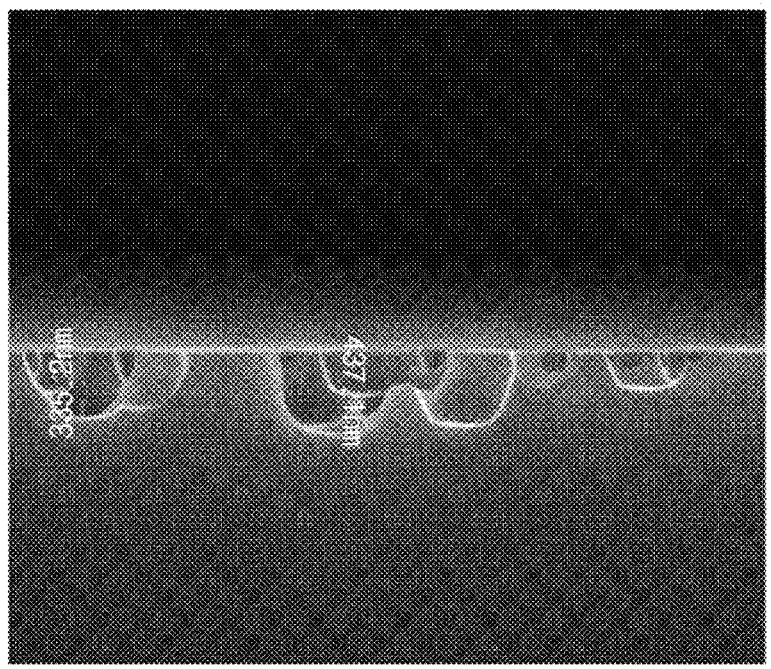

FIGS. 23 and 24 illustrate an example in which a single crystalline wafer is textured by applying a nano-etch mask according to an exemplary embodiment. An aqueous solution in which HF, $HNO_3$, and $HPO_3$ were mixed at a ratio of 1:5:30, which enabled an isotropic etching process, was used as an etchant.

By using the above-described etchant, a secondary wet etching process corresponding to the above-described second etching operation S250 was performed on a semiconductor substrate including a $SiN_x$ dielectric thin film, which has a thickness of about 60 nm and $MgF_2$ metal nanoparticles having a nominal thickness of about 105 nm, and a semiconductor substrate, which includes a $SiN_x$ dielectric thin film having a thickness of about 55 nm and $MgF_2$ metal nanoparticles having a nominal thickness of about 105 nm, for 3 minutes and 30 seconds and five minutes, respectively. As a result, nanoholes structures Nanohole #1 and Nanohole #2 were formed on the semiconductor substrates, respectively.

FIG. 23 shows Nanohole #1, and FIG. 24 shows Nanohole #2. Since an etch rate of an isotropic etchant used to form the nanoholes does not depend on a crystal orientation of a wafer, the method 200 of texturing a semiconductor substrate may be applied to a substrate having an arbitrary crystal orientation. When a double thin film formed of $SiN_x/MgF_2$ is deposited on the manufactured nanostructures, very high antireflection performance may be obtained. Therefore, it can be seen that the nanoholes structure manufactured by using the present technique may be applied to an arbitrary crystal orientation and implement excellent light trapping characteristics.

Figure 25:
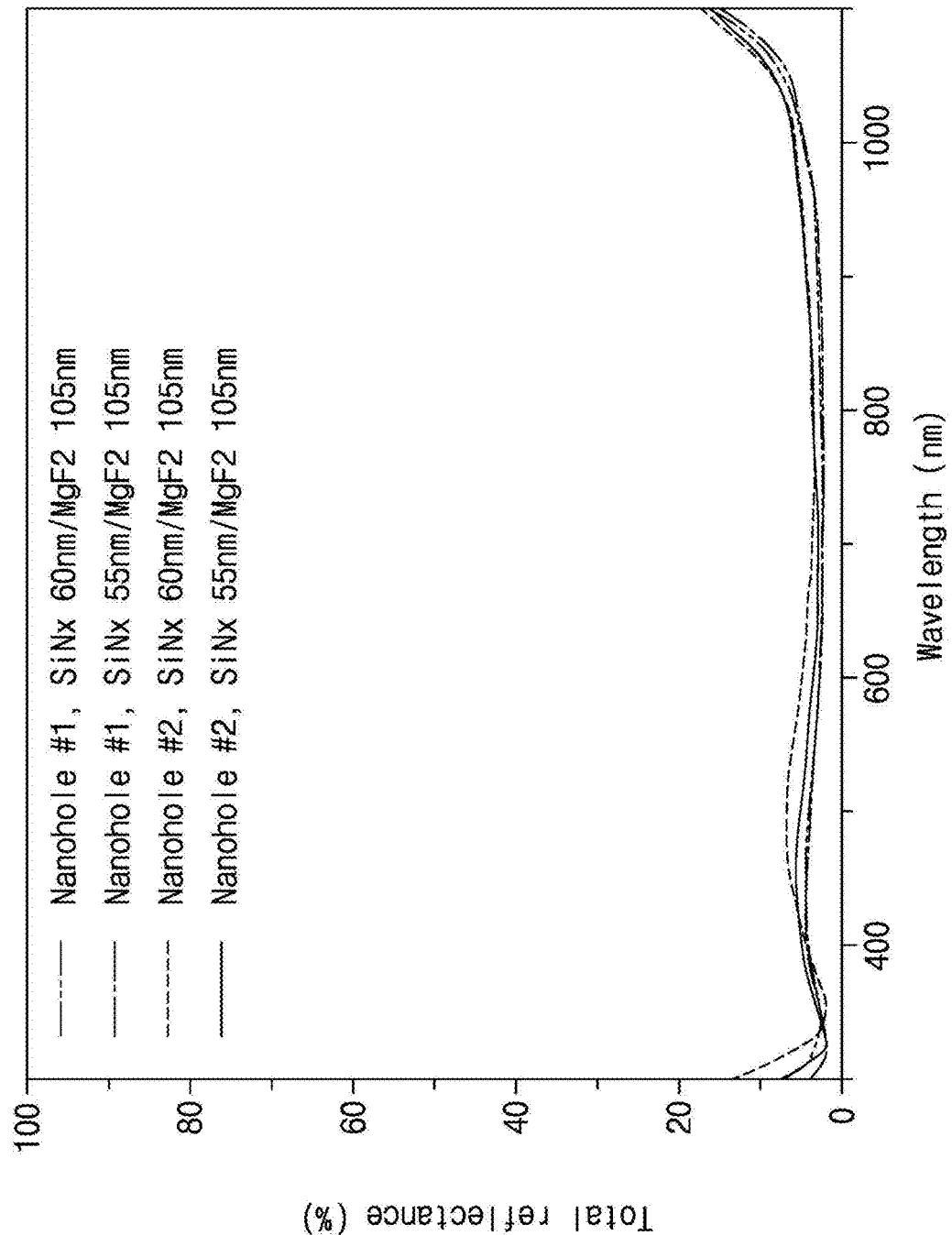

FIG. 25 is a graph showing measurement results of total reflectance relative to wavelength of a semiconductor substrate, and the measurement results are obtained using an integrated sphere with reference to FIGS. 23 and 24. The following Table 3 shows some of the results shown in the graph of FIG. 25.

TABLE 3

| | Nanohole #1 | Nanohole #2 |
|---|---|---|
| $SiN_x$ 55 nm/$MgF_2$ 105 nm | 2.57(%) | 3.67(%) |
| $SiN_x$ 60 nm/$MgF_2$ 105 nm | 2.72(%) | 4.38(%) |

The semiconductor substrates 101 and 102 textured according to the present invention may exhibit high light absorptances due to a low reflectance of incident light and have high charge collection efficiency because a rate of increase in surface area is low during a texturing process. Particularly, ultrathin wafer-based solar cells including the semiconductor substrates 101 and 102 may have improved light absorption performance.

That is, the present invention may increase light absorptances of ultrathin silicon solar cells including the semiconductor substrates 101 and 102 manufactured using the method 200 of texturing a semiconductor substrate to improve photoelectric efficiency thereof and enable manufacture of highly efficient ultrathin solar cells having low power generation costs. Further, the present invention may enable manufacture of lightweight and highly efficient silicon solar cells having mechanically flexible characteristics, and provide the method 200 of texturing a semiconductor substrate, which is economical and applicable to a full-wafer-scale large-area process. The semiconductor substrates 101 and 102 manufactured using the method 200 may have high light absorptances and be applied to ultrathin solar cells.

In addition, the semiconductor substrates 101 and 102 according to the present invention may be used for photovoltaic devices, optical and electrochemical detectors/sensors, biodetectors/biosensors, catalysts, electrodes, and other devices configured to reduce reflection of incident light in addition to solar cells to reduce reflection of incident light and improve efficiency of the devices.

A semiconductor substrate textured according to the present invention can exhibit high light absorptance due to low reflectance of incident light, and have high charge collection efficiency because a rate of increase in surface area is low during a texturing process. In particular, the semiconductor substrate textured according to the present invention is effective in maximizing light absorption of an ultrathin wafer-based solar cell.

According to the present invention, photoelectric efficiency can be improved by increasing light absorptance of an ultrathin silicon solar cell, and it is possible to manufacture a highly efficient ultrathin solar cell having low power generation costs.

According to the present invention, it is possible to manufacture a lightweight and highly efficient silicon solar cell having mechanically flexible characteristics.

According to the present invention, a method of texturing a semiconductor substrate, which is economical and applicable to a full-wafer-scale large-area process, can be provided. A semiconductor substrate manufactured using the method can have high light absorptance and be applied to an ultrathin solar cell.

It should be understood that effects of the present invention are not limited to the above-described effects and include all effects that may be inferred from the detailed description of the present invention or the composition of the present invention set forth in the claims.

It should be understood by those skilled in the art that various changes in form and details may be made therein without departing from the spirit and scope of the invention as defined by the appended claims. Thus, it should be understood that the above-described embodiments are not restrictive but illustrative in all aspects. For example, each component described as a single type may be distributed and implemented, while components described as being distributed may also be combined and implemented. Therefore, the scope of the invention is defined by the appended claims, and all changes or modifications derived from the scope of the claims and equivalents thereof should be construed as being included in the present invention.

What is claimed is:

1. A method of texturing a semiconductor substrate, the method comprising:
   depositing a dielectric thin film on a semiconductor substrate;
   forming metal nanoparticles on the semiconductor substrate;
   primarily etching the semiconductor substrate;
   removing the metal nanoparticles; and
   secondarily etching the primarily etched semiconductor substrate to form nanostructures;
   wherein the forming of the metal nanoparticles comprises forming the metal nanoparticles on the dielectric thin film at room temperature without an annealing process using a physical vapor deposition by applying bimodal growth process of simultaneously growing large metal nanoparticles and small metal nanoparticles,
   the primary etching of the semiconductor substrate comprises etching the dielectric thin film and the semiconductor substrate to pattern the dielectric thin film on the semiconductor substrate,
   the removing of the metal nanoparticles comprises removing the metal nanoparticles formed on the dielectric thin film, and
   the secondary etching of the primarily etched semiconductor substrate comprises etching the dielectric thin film patterned during the primary etching of the semiconductor substrate and the semiconductor substrate etched during the primary etching of the semiconductor substrate to form nanostructures.

2. The method of claim 1, wherein the semiconductor substrate is formed of a crystalline silicon wafer, and
   the secondary etching of the primarily etched semiconductor substrate comprises etching the dielectric thin film patterned during the primary etching of the semiconductor substrate and the semiconductor substrate etched during the primary etching of the semiconductor substrate to form silicon nanostructures having a pyramid shape or an elliptical hole shape.

3. The method of claim 1, wherein the secondary etching of the primarily etched semiconductor substrate comprises etching the dielectric thin film patterned during the primary etching of the semiconductor substrate and the semiconductor substrate etched during the primary etching of the semiconductor substrate to form nanostructures, and
   the nanostructures are formed to have a depth of 100 nm to 1000 nm.

4. The method of claim 1, wherein the dielectric thin film comprises a silicon-based nitride, a silicon-based oxide, a silicon oxynitride, or an aluminum-based oxide and is a type of single layer or multilayered thin film.

5. The method of claim 1, wherein the dielectric thin film has a thickness of 50 nm to 400 nm.

6. The method of claim 1, wherein the metal nanoparticles are formed of indium (In), tin (Sn), or an In—Sn alloy which has a melting point of 250° C. or lower.

7. The method of claim 1, wherein a nominal thickness of the metal nanoparticles ranges from 50 nm to 200 nm.

8. The method of claim 1, wherein a size of the small metal nanoparticles generated using the bimodal growth process is more than 0% of a size of the large metal nanoparticles and equal to or less than 50% of the size of the large metal nanoparticles, and an average diameter of the large metal nanoparticles is more than 0 nm and equal to or less than 1,000 nm.

9. The method of claim 1, wherein the primary etching of the semiconductor substrate comprises etching the dielectric thin film and the semiconductor substrate to pattern the dielectric thin film on the semiconductor substrate, and
   the dielectric thin film and the semiconductor substrate are etched to have a depth of 100 nm to 500 nm.

10. The method of claim 1, wherein the secondary etching of the primarily etched semiconductor substrate comprises wet etching the semiconductor substrate by using the dielectric thin film, which is patterned during the primary etching of the semiconductor substrate, and a solution including any one of hydrogen fluoride, nitric acid, acetic acid, and phosphoric acid or a mixture of at least two thereof, and forming nanostructures having an elliptical hole shape.

* * * * *